United States Patent [19]

Juskey et al.

[11] Patent Number: 5,132,778

[45] Date of Patent: Jul. 21, 1992

[54] TRANSFER MOLDING COMPOUND

[75] Inventors: Frank J. Juskey, Coral Springs; Robert W. Pennisi, Boca Raton; Marc V. Papageorge, Plantation, all of Fla.

[73] Assignee: Motorola, Inc., Schaumburg, Ill.

[21] Appl. No.: 583,751

[22] Filed: Sep. 17, 1990

[51] Int. Cl.$^5$ ............................................. H01L 23/28
[52] U.S. Cl. ..................................... 357/72; 174/256; 523/139
[58] Field of Search ........................... 357/72; 174/256; 523/139

[56] References Cited

U.S. PATENT DOCUMENTS

| | | | |
|---|---|---|---|
| 3,653,959 | 4/1972 | Kehr et al. | 357/72 |
| 4,043,027 | 8/1977 | Birchler et al. | 29/588 |
| 4,654,407 | 3/1987 | Domeier | 526/262 |
| 4,691,025 | 9/1987 | Domeier et al. | 528/172 |
| 4,743,647 | 5/1988 | Domeier | 526/262 |
| 4,774,282 | 9/1988 | Qureshi | 525/422 |
| 4,812,511 | 3/1989 | Domeier | 526/262 |
| 4,853,449 | 8/1989 | Domeier | 526/262 |
| 4,861,823 | 8/1989 | Qureshi | 528/422 |
| 4,999,699 | 3/1991 | Christie et al. | 357/65 |

OTHER PUBLICATIONS

Michael S. Rhodes, "Polyanhydride Flexibilizing Hardeners for Epoxy Resins" *Insulation/Circuits*, Dec. 1977.
D. A. Shrimp and W. M. Craig, Jr., "New Liquid Dicyanate Monomer for Rapid Impregnation of Reinforcing Fibers", 34th International SAMPLE, May 8, 1989.

*Primary Examiner*—Andrew J. James
*Assistant Examiner*—Sara W. Crane
*Attorney, Agent, or Firm*—Dale W. Dorinski; Daniel K. Nichols

[57] ABSTRACT

Briefly, according to the invention, a transfer molding compound is made from an epoxide resin, a cyanate ester, and a catalyst. The molding compound is used to encapsulate semiconductor devices to fabricate individual packages or to encapsulate devices mounted directly on a circuit carrying substrate.

6 Claims, No Drawings

TRANSFER MOLDING COMPOUND

TECHNICAL FIELD

This invention relates generally to the manufacture of semiconductor devices, and more particularly to an improved material for encapsulating electrical circuit devices, such as transistors, integrated circuits and the like.

BACKGROUND

Semiconductor devices are very small and delicate, and must be protected from physical and environmental damage. Traditionally, the devices have been enclosed in a metal can, encapsulated by covering or potting with an organic material, or encapsulated in plastic by casting or molding. The latter method, known as transfer molding, places the semiconductor device, which has been electrically connected to a lead structure, lead frame, or circuit carrying substrate, in a mold cavity. A thermoset material is molded around the semiconductor device to form a solid monolithic unit that is sealed from environmental damage and is rugged enough to withstand physical damage while being assembled onto a circuit board. This technology may be used to form a package for an individual component, or may be used to encapsulate a semiconductor device that has been mounted directly on a circuit carrying substrate.

The molding machine is a hydraulically operated transfer mold. The molding resin is formed into a mass of precisely calculated size and shape. The amount of molding material is critical, in that there must be adequate material to completely fill the mold cavity so that no voids are left in the molded semiconductor packages. Excess molding material forces the mold to open and create flash around the edges of the molded packages, necessitating undesirable deburring and touch up operations. The mold resin is heated by a high frequency preheater and is moved into a part of the mold cavity known as the pot. The resin is further heated inside the pot and is injected into the individual mold cavities under pressure to flow around the semiconductor devices and form the molded package. A plunger forces the resin through the runners and gates, into the cavity portion of the mold. During injection and flow, the molding material begins to cure and continues curing for a predetermined time after flow has stopped. After the specified curing time, the mold is opened and the molded packages are taken out of the mold tool and separated from the runners and gates.

Molding resins used for semiconductor use are classified as thermoplastic or thermoset, with thermoset being the predominant type of resin. Thermoplastics typically exhibit problems such as melting or blistering during soldering of the semiconductor package, and the high moisture uptake of the resin leads to loss of dielectric properties. Silicone, epoxy and silicone modified epoxy resins are the thermoset resins used for encapsulating semiconductor devices. Silicone was originally used because of high heat resistance and high purity. Silicone modified epoxies offered high thermal resistance, with the advantage of lower price. However, silicones and silicone-epoxy resins have essentially been replaced by epoxies because of the lower price and higher reliability of modern epoxy resins.

Early epoxies were based on bisphenol A (also known as p,p'-dihydroxydiphenyldimethylene)-epichlorohydrin with an acid anhydride used as a hardener or curing agent. Resins derived from bisphenol A and epichlorohydrin can be described by the following general formula:

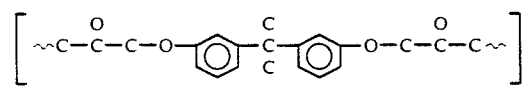

GENERAL EPOXY FORMULA

This idealized formula shows two epoxide end groups. In practice, side reactions intervene so that commercial resins average between 1.9 and 1.3 epoxide end groups per molecule. Commerical epoxy resins of this type are represented by Araldite 6010 (Ciba-Geigy), Epi-Rez 510 (Hoescht-Celanese), Epon 828 (Shell), and Epotuf 37-140 (Reichold).

The introduction of low pressure transfer molding techniques has resulted in the broad use of phenol or cresol novolac-modified epoxy resins. The epoxy novolac resins combine the reactivity of the epoxy group and the thermal resistance of the phenolic backbone. They are synthesized by reacting epichlorohydrin with novolac resin. The latter is obtained by condensing phenol with formaldehyde under acidic conditions and at formaldehyde-to-phenol molar ratios between 0.5 to 0.8. Epoxy-novolac resins can be represented by the following structural formula:

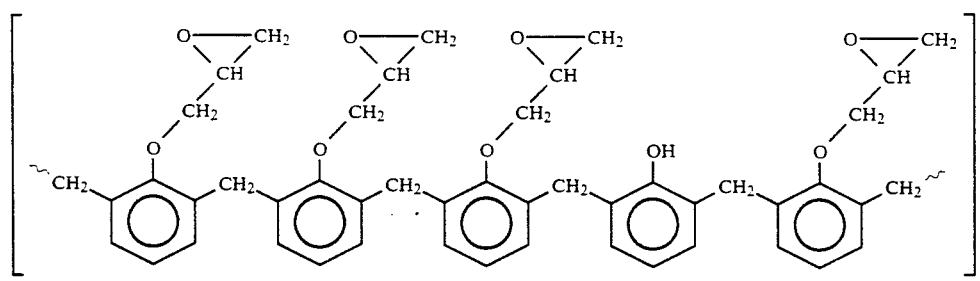

EPOXIDIZED NOVOLAC RESIN FORMULA

The high epoxide functionality, in comparison with bisphenol A- epichlorohydrin resins, results in a higher crosslink density and hence improved heat resistance. The novolac resins can also be prepared from substituted phenols such as cresols, polyhydroxy phenols such as resorcinol, or polyaromatic phenols. The curing mechanism of these resins is quite complex. The very reactive epoxide groups may catalytically react with each other in the presence of Lewis acids or Lewis bases, or they may react with acids, anhydrides or amines to crosslink. In addition, the novolac resin may also crosslink.

Although the basic reactions are well understood, commercial epoxy transfer molding compounds are complex mixtures of epoxy resin, curing agent, catalyst, filler, flame retardant, coupling agent, release agent, coloring agent and stress reliever. The final properties of the cured product depend strongly on the physical and chemical interactions of the many constituents. Although the epoxy-novolac resins offer superior performance over earlier materials, they still suffer from a number of disadvantages that prevent wider use in the modern semiconductor industry. Stress relievers are required to compensate for the shrinkage of the resin during the cure cycle. Ionic contaminants in the curing agents must be totally removed to prevent corrosion of the semiconductor device. This has proven to be an expensive and difficult process. Modern electronics applications require higher heat resistance and higher moisture resistance than epoxy-novolac resins can offer. The need to add flame retardants further complicates the purity of the resin, adding to corrosion problems. When used to encapsulate a semiconductor device that has been mounted directly on circuit carrying substrates employing modified epoxy resins, the conventional epoxy-novolacs suffer from poor adhesion to the substrate and a mismatch in co-efficient of thermal expansion of the substrate.

Clearly, an improved resin system for use in transfer molding semiconductor device packages is needed.

SUMMARY OF THE INVENTION

Briefly, according to the invention, a transfer molding compound comprising an epoxide resin, a cyanate ester, and a catalyst is used to encapsulate semiconductor devices.

DETAILED DESCRIPTION OF THE PREFERRED EMBODIMENT

It has been discovered that cyanate ester resins, acting as curing agents for epoxy resins, result in a material for use in transfer molding that provides improved properties over conventional epoxy-novolac transfer molding compounds. Cyanate esters function as curing agents for epoxide resins through a combination of oxazoline ring formation, catalysis of the polyetherification reaction of the epoxide ring, and cyclotrimerization of the cyanate ester. The cyclotrimerization reaction proceeds initially, and the cyanurate rings which form are extremely stable, imparting excellent thermal and hydrolytic stability to the cured resin. Because no leaving groups or volatile byproducts are formed during the cyclotrimerization reaction, the cured material is free from undesirable contaminants. The rate and extent of oxazoline ring formation and polyetherification may be controlled through the stoichiometry of the resin formulation. For example, a resin blend of 40% to 50% cyanate ester and the remainder epoxy novolac provides a cured resin suitable for use in transfer molding semiconductor devices. By increasing the amount of cyanate ester, the cyclotrimerization reaction becomes more predominant, and the thermal stability of the cured resin is thereby improved, resulting in a cured resin with a higher glass transition temperature.

A cyanate ester of the formula

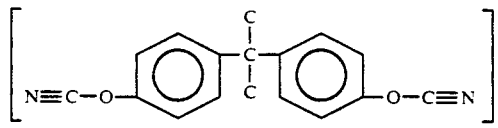

GENERAL CYANATE ESTER FORMULA is used in the preferred embodiment of the novel transfer molding compound. Other cyanate esters of the general formula

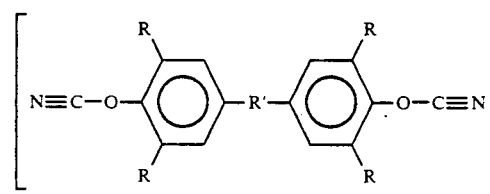

GENERAL SUBSTITUTED CYANATE ESTER FORMULA may also be substituted. In one aspect, R may be a methyl group or R' may be methyl, ethyl, propyl, fluorine substituted propyl, or sulfur. The following serve as examples, and it should be appreciated that other similarly substituted materials may also be useful.

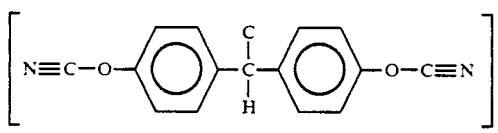

TETRA-O-METHYLBISHPENOL A DICYANATE

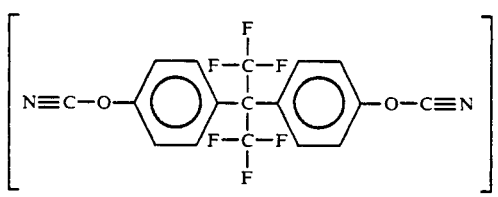

HEXAFLUOROBISPHENOL A DICYANATE

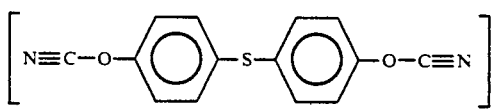

THIODIPHENOL DICYANATER

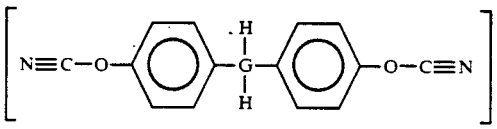

BISPHENOL E DICYANATE

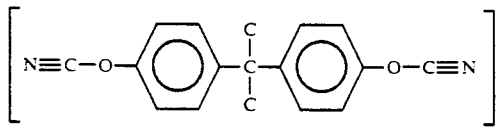

BISPHENOL A DICYANATE

Since the trimerization rates of uncatalyzed cyanate esters are impractically slow, transition metal carboxylates, such as zinc, copper, cobalt, or manganese octoates, napthenates, or acetylacetonates dissolved in a nonvolatile alklyphenol liquid, such as nonylphenol, are employed as catalysts to accelerate the reaction.

A preferred embodiment of the molding compound will be described in more detail in the following example. In addition to the epoxide resin, cyanate ester resin, and catalyst, additional materials such as fillers, coupling agents, and release agents are added to the formula to aid in processing. Fillers such as carbon black and fused or amorphous silica have been used, but other similar materials may also be employed to give the desired results. Fused silica in the particle size range of 15–50 microns is preferable. Silane coupling agents are most preferred, with 3-glycidoxypropyltrimethoxysilane and 2-cyanoethyltriethoxysilane being two examples. Release agents such as carnauba wax are added to enhance removal of the molded device from the mold cavity. It should be appreciated that other types of waxes known to those skilled in the art may also be used.

EXAMPLE 1

|  | Wt. (%) |
| --- | --- |
| Hi Tek B-10 Cyanate Ester | 10 |
| Shell DTS155 Epoxy | 11 |
| Nonylphenol | 2.7 |
| Zinc Acetylacetonate | 0.9 |
| Fused Silica | 74 |
| 3-Glycidoxypropyltrimethoxysilane | 0.6 |
| Carnauba Wax | 0.4 |
| Carbon Black | 0.4 |

An alternate embodiment of the molding compound will be described in more detail in the following example.

EXAMPLE 2

|  | Wt. (%) |
| --- | --- |
| Hi Tek B-30 Cyanate Ester | 12 |
| Shell DTS155 Epoxy | 9.3 |
| Nonylphenol | 4.0 |
| Copper Acetylacetonate | 0.3 |
| Fused Silica | 73 |
| 3-Glycidoxypropyltrimethoxysilane | 0.6 |
| Carnauba Wax | 0.4 |
| Carbon Black | 0.4 |

A transfer molding compound made from the above formulas provides the advantages of improved stress relief in the molded package by way of reduced resin shrinkage. The low ionic content of the cyanate ester resins serve to provide a molded package that has superior resistance to corrosion of the semiconductor device. Improved heat resistance and improved moisture resistance of the cyanate ester modified epoxy molding compound provides for easier manufacturing of the semiconductor package and greater processing latitude during circuit assembly, thereby reducing the need to closely monitor the moisture content of the resin. The inherent flame retardancy of the cyclotrimerized ring eliminates the need to add flame retardants to the molding compound, further reducing the cost and increasing the manufacturing process latitude and reducing potential corrosion problems in the molded package.

An encapsulated semiconductor package may be made from the above transfer molding compounds by molding a semiconductor device mounted on a lead frame in a mold cavity using conventional equipment. A similar package may be made by mounting the semiconductor device directly on a circuit carrying substrate and molding the device using conventional equipment. When used to encapsulate a semiconductor device mounted directly on circuit carrying substrates made from modified epoxy resins, the cyanate ester epoxy resin provides improved adhesion to the substrate and a closer match to the coefficient of thermal expansion of the substrate, creating a more reliable package.

What is claimed is:

1. A transfer molding compound comprising an epoxide resin, a cyanate ester and a catalyst, wherein the cyanate ester is selected from the group consisting of bisphenol A dicyanate, tetra-O-methylbisphenol F dicyanate, thiodiphenol dicyanate, hexafluorobisphenol A dicyanate, and bisphenol E dicyanate.

2. A transfer molding compound comprising an epoxide resin, a cyanate ester and a catalyst, the catalyst comprising a transition metal carboxylate.

3. The molding compound of claim 2, wherein the catalyst is selected from the group consisting of zinc octoate, cobalt octoate, copper octoate, manganese octoate, zinc napthenate, cobalt napthenate, copper napthenate, manganese napthenate, zinc acetylacetonate, cobalt acetylacetonate, copper acetylacetonate, and manganese acetylacetonate.

4. A transfer molding compound comprising:
   a novolac-modified epoxide resin;
   a cyanate ester selected from the group consisting of bisphenol A dicyanate and bisphenol E dicyanate; and
   a catalyst selected from the group consisting of zinc acetylacetonate and copper acetylacetonate.

5. An integrated circuit package comprising:
   an integrated circuit;
   a lead structure;
   an encapsulant, comprising a novolac-modified epoxide resin, a cyanate ester selected from the group consisting of bisphenol A dicyanate, tetramethylbisphenol F dicyanate, thiodiphenol dicyanate, hexafluorobisphenol A dicyanate, and bisphenol E dicyanate; and
   a catalyst selected from the group consisting of zinc octoate, cobalt octoate, copper octoate, manganese octoate, zinc napthenate, cobalt napthenate, copper napthenate, manganese napthenate, zinc acetylacetonate, cobalt acetylacetonate, copper acetylacetonate, and manganese acetylacetone.

6. A circuit board assembly, comprising:
   a circuit carrying substrate having a plurality of electrical connections arranged in a pattern to receive an integrated circuit;
   an integrated circuit electrically connected to the circuit carrying substrate;

a molding compound to encapsulate the integrated circuit, the molding compound comprising a novolac-modified epoxide resin, a cyanate ester selected from the group consisting of bisphenol A dicyanate, tetramethylbisphenol F dicyanate, thiodiphenol dicyanate, hexafluorobisphenol A dicyanate, and bisphenol E dicyanate; and a catalyst selected from the group consisting of zinc octoate, cobalt octoate, copper octoate, manganese octoate, zinc napthenate, cobalt napthenate, copper napthenate, manganese napthenate, zinc acetylacetonate, cobalt acetylacetonate, copper acetylacetonate, and manganese acetylacetonate.

* * * * *